(12) United States Patent
Petrenko et al.

(10) Patent No.: US 8,183,743 B2
(45) Date of Patent: May 22, 2012

(54) TUBULAR LINEAR PIEZOELECTRIC MOTOR

(75) Inventors: Serhiy Petrenko, Kiev (UA); Valentin R. Zhelyaskov, Sarasota, FL (US)

(73) Assignee: Discovery Technology International, Inc., Sarasota, FL (US)

( * ) Notice: Subject to any disclaimer, the term of this patent is extended or adjusted under 35 U.S.C. 154(b) by 0 days.

(21) Appl. No.: 13/094,478

(22) Filed: Apr. 26, 2011

(65) Prior Publication Data

US 2011/0260579 A1    Oct. 27, 2011

Related U.S. Application Data

(60) Provisional application No. 61/327,984, filed on Apr. 26, 2010.

(51) Int. Cl.
*H01L 41/00* (2006.01)

(52) U.S. Cl. .......... 310/323.06; 318/369; 318/558; 310/317; 310/323.02; 310/323.16; 310/365; 310/328; 251/129.01; 137/554

(58) Field of Classification Search .......... 318/369, 318/558; 310/365, 328, 323.16, 323.08, 310/317, 323.02, 90, 29.01, 323.05, 323.04, 310/369; 251/129.01; 137/554
See application file for complete search history.

(56) References Cited

U.S. PATENT DOCUMENTS

| | | | |
|---|---|---|---|
| 4,453,103 A * | 6/1984 | Vishnevsky et al. | 310/323.02 |
| 2009/0152994 A1* | 6/2009 | Numata et al. | 310/348 |
| 2010/0019621 A1* | 1/2010 | Funakubo et al. | 310/323.16 |

* cited by examiner

*Primary Examiner* — Walter Benson
*Assistant Examiner* — Jorge Carrasquillo
(74) *Attorney, Agent, or Firm* — Fox Rothschild, LLP; Robert J. Sacco

(57) ABSTRACT

Tubular linear piezoelectric motor (100, 300), and a method for exciting a tubular piezoelectric resonator (101, 301) used in such motor. The motor is comprised of a resonator (101, 301) formed of a cylindrical tube. The tube has length $nL$ comprised of a piezoelectric material, where L is some length, and n is an even numbered integer, greater than zero. The piezoelectric material of the cylindrical tube is polarized in a radial direction, perpendicular at each point to the interior and exterior surface of the cylindrical tube. The resonator is excited with one signal having a single exciter frequency applied across an inner electrode (102, 302) and one or more first outer electrodes (103, 103a, 103b). The single exciter frequency is selected to move a contact site of one or more annular protrusions along an elliptical path when the resonator is excited. The resonator is disposed within an outer tube (106) and configured so that excitation of the resonator using the first outer electrode(s) produces linear displacement as between the outer tube and the resonator in a first direction. Excitation of a second outer electrode (104, 104a, 104b) produces the linear displacement in a second direction opposite to the first direction.

31 Claims, 3 Drawing Sheets

TUBULAR LINEAR PIEZOELECTRIC MOTOR

CROSS REFERENCE TO RELATED APPLICATIONS

This application is a non-provisional application which claims the benefit of U.S. Provisional Application No. 61/327,984, filed Apr. 26, 2010, the entirety which is incorporated herein by reference.

BACKGROUND OF THE INVENTION

1. Statement of the Technical Field

The inventive arrangements relate to piezoelectric motors, and more particularly a simplified design of a tubular linear piezoelectric motor.

2. Description of the Related Art

Linear piezoelectric motors are well known in the art. However, there is a continuing need to develop piezomotors that are simple, inexpensive and robust. One aspect of piezoelectric motors which can add to complexity is the drive system for the motor, including the generator used to provide electric drive signals. Common arrangements require two or more sinusoidal drive signals for exciting a piezoelectric resonator. However, in such systems it can be difficult to keep various vibration modes independent and to maintain a required phase difference between such modes. These problems can increase complexity and cost of piezoelectric motors.

SUMMARY OF THE INVENTION

Embodiments of the invention concern a tubular linear piezoelectric motor, and a method for exciting a tubular piezoelectric resonator used in such motor. The motor is comprised of a resonator formed of a cylindrical tube. The tube has length $nL$ comprised of a piezoelectric material, where L is some length, and n is an even numbered integer, greater than zero. The piezoelectric material of the cylindrical tube is polarized in a radial direction, perpendicular at each point to the interior and exterior surface of the cylindrical tube.

The resonator has an inner electrode formed of a conductive material disposed on an interior surface of the cylindrical tube. One or more annular protrusions are each disposed at a different unique location on an exterior surface of the cylindrical tube. Each of the unique location(s) is spaced a different distance $mL$ from a first end of the cylindrical tube, where m is an odd numbered integer and $n>m$. A first outer electrode is provided for each annular protrusion. Each of the first outer electrode(s) is formed of a conductive material that is disposed on the exterior surface of the cylindrical tube, and respectively located on one side of a respective one of the annular protrusions. According to one aspect of the invention, a plurality of the first outer electrodes are electrically connected together to form a first group of electrodes configured for concurrent excitation.

Each of the annular protrusions comprises a contact site. The resonator is configured to move the contact site along a respective elliptical path when it is excited with one signal having a single exciter frequency. The exciter signal is applied across the inner electrode and the one or more first outer electrode(s). The tubular linear piezoelectric motor can include an exciter configured to generate the exciter signal. The resonator is snugly disposed within an outer tube, and the contact site is configured to frictionally engage an inner surface of the outer tube when the contact site moves along the elliptical path.

The resonator has a natural frequency $v_2$ of an $n^{th}$ even order longitudinal vibration mode in a direction along the length of the resonator. The natural frequency is equal to $C_{sw}^2/(2L)$, where $C_{sw}^2$ is the velocity of sound waves traveling in a longitudinal direction aligned with the length of the resonator. According to one aspect, the resonator has a natural frequency $v_1$ of a first order radial mode of the resonator is equal to $C_{sw}^1/(\pi D)$, where D is a diameter of the cylindrical tube, and $C_{sw}^1$ is the velocity of the sound waves traveling in a radial direction within the resonator. The resonator is advantageously configured so that $0.5\ kHz < |v_1 - v_2|$. The single exciter frequency $v_3$ is close to the natural frequencies $v_1$ and $v_2$ and produces a phase difference of approximately 90 degrees between the vibrations associated with the even order longitudinal vibration mode at frequency $v_2$ and the first order radial mode at frequency $v_1$.

According to another aspect of the invention, the resonator has a natural frequency $v_1$ of a first order longitudinal mode along the thickness of the resonator is equal to $C_{sw}^1/(\pi d)$, where d is a thickness d of the cylindrical tube, and $C_{sw}^1$ is the velocity of the sound waves traveling in a longitudinal direction within the thickness d of the resonator. The resonator is advantageously configured such that $0.5\ kHz < |v_1 - v_2|$. The single exciter frequency $v_3$ is close to the natural frequencies $v_1$ and $v_2$ and produces a phase difference of approximately 90 degrees between the vibrations associated with the even order longitudinal vibration mode at frequency $v_2$ and the first order longitudinal mode at frequency $v_1$.

In an embodiment of the invention, one or more second outer electrodes can be provided on the resonator. Each second outer electrode is formed of a conductive material disposed on the exterior surface of the cylindrical tube, and respectively located on one side of a respective one of the annular protrusions opposed from the first outer electrode. A plurality of the second outer electrodes, distinct from the first outer electrodes, can be electrically connected together to form a second group of electrodes configured for concurrent excitation. The tubular linear piezoelectric motor is configured so that excitation of the first outer electrode (or group of first outer electrodes) with the signal produces linear displacement as between the outer tube and the resonator in a first direction. Conversely, excitation of the second outer electrode (or group of second outer electrodes) produces the linear displacement in a second direction opposite to the first direction The method for exciting a tubular piezoelectric resonator in a linear motor, can include snugly disposing within an outer tube a resonator formed of a cylindrical tube of length $nL$. The cylindrical tube is comprised of a piezoelectric material, where L is some length, and n is an even numbered integer, greater than zero. The method can also include coupling an exciter signal to an inner electrode formed of a conductive material disposed on an interior surface of the cylindrical tube. One or more annular protrusions is arranged, each at a different unique location on an exterior surface of the cylindrical tube. Each of the unique locations is spaced a different distance $mL$ from a first end of the cylindrical tube, where m is an odd numbered integer and $n>m$. The method further involves coupling the exciter signal to one or more first outer electrodes formed of a conductive material disposed on the exterior surface of the cylindrical tube on one side of each the annular protrusion. Finally, the resonator is excited with one signal having a single exciter frequency applied across the inner electrode and the one or more first (or alternatively second) outer electrodes. The single exciter frequency is selected to move a contact site of the one or more annular protrusions along an elliptical path when the resonator is excited.

BRIEF DESCRIPTION OF THE DRAWINGS

Embodiments will be described with reference to the following drawing figures, in which like numerals represent like items throughout the figures, and in which.

DETAILED DESCRIPTION

Figures 1A, 1B:
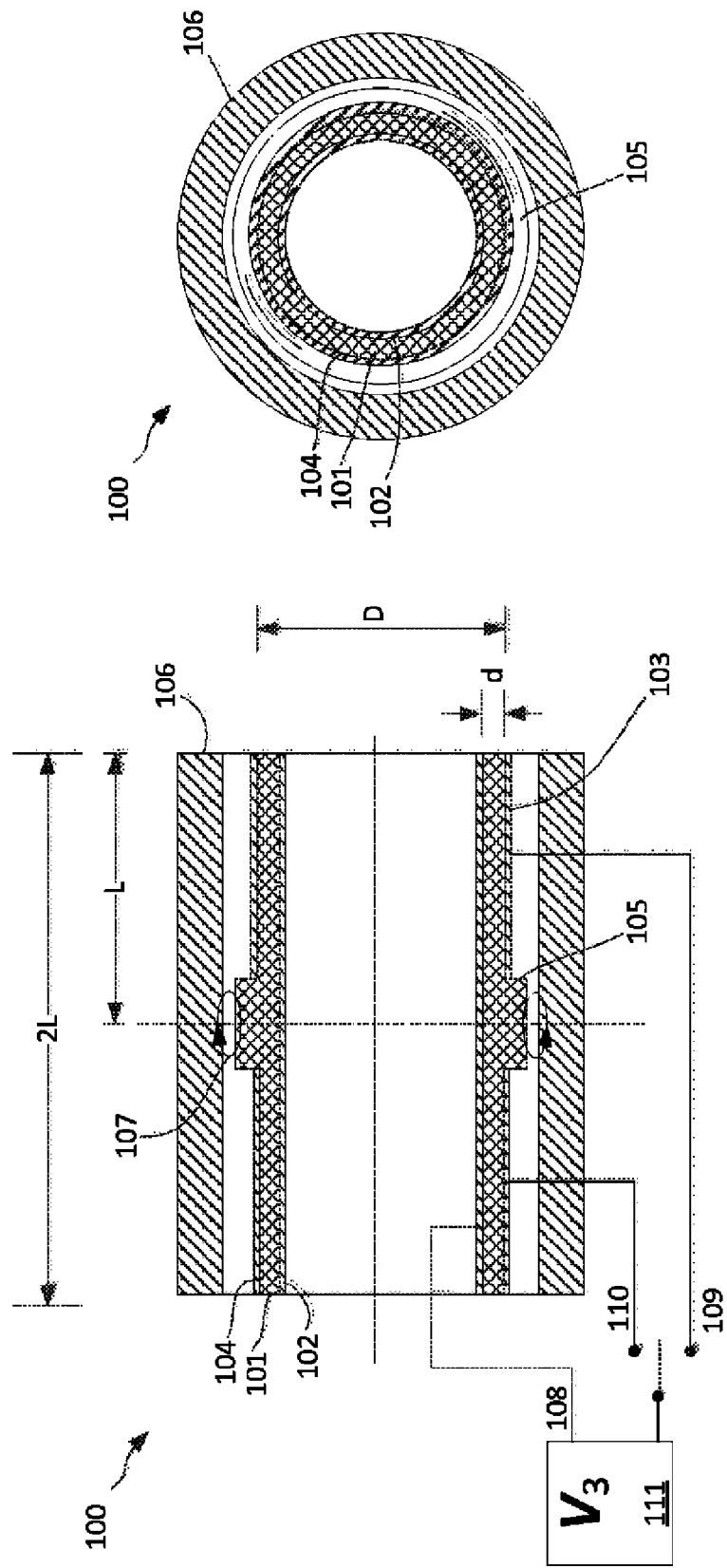
FIG. 1A is an axial cross-sectional view of a first embodiment of a tubular linear piezoelectric motor.
FIG. 1B is a radial cross-sectional view of the embodiment of the tubular linear piezoelectric motor shown in FIG. 1A.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring now to FIGS. 1A and 1B there is shown a tubular piezoelectric linear motor 100, which includes a resonator 101, outer tube 106, and a generator 111 for excitation of the resonator. The resonator 101 has a length 2L, a diameter D, and a thickness d. The resonator can be formed of any suitable piezoelectric material. For example in an embodiment of the invention, the resonator can be formed of barium titanate, or lead-zirconate-titanate (PZT). The resonator 101 is polarized radially, i.e. the piezoelectric material forming the resonator is polarized in a direction perpendicular to the inner and outer cylindrical surface of the resonator.

On the inner surface of resonator 101 is formed a common electrode 102. The common electrode 102 is fabricated from a conductive material, such as silver. On the external surface of resonator 101 are formed two circular-section electrodes (or ring electrodes) 103 and 104. The electrodes 103 and 104 can be generally identical to one another with regard to their form and structure. Electrodes 103 and 104 are formed of a suitable conductive material, such as silver. In a linear motor embodiment of the invention, the resonator 101 can be situated within a concentric outer tube 106 which is described below in greater detail.

Electrodes 103 and 104 are separated by an annular protrusion 105 on the outer surface of resonator 101. In the embodiment shown in FIG. 1, the protrusion 105 is located midway along the length of the resonator 101. The protrusion 105 forms a frictional-acoustical contact site along its outer periphery which engages with the inner surface of the outer tube 106. The term "frictional-acoustical" contact site is used here in order to emphasize that the peripheral surface of the protrusion is capable of transferring directly un-attenuated ultrasound energy generated by the piezoelectric resonator by using frictional forces between the protraction 105 and the outer tubing 106. With the foregoing arrangement, acoustic energy can be directly applied to the concentric outer tube 106 when the resonator 101 is excited and used in a linear motor configuration as hereinafter described.

According to one aspect of the invention, the protrusion 105 can be integrally formed as part of the resonator 101. More particularly, the protrusion can be formed as a continuous annular band extending around the outer surface of the resonator 101. However, the invention is not limited in this regard and, in other embodiments, the protrusion can be segmented such that the surface of the protrusion 105 is discontinuous around the circumference of the resonator. Still, a segmented annular protrusion can be less desirable in some applications as it would result in a segmented contact site when the resonator 101 is used as part of motor assembly as hereinafter described. In particular, a segmented protrusion can potentially decrease the maximum generated force which can be exerted by the protrusion upon the outer tube 106 when the resonator is used in a linear motor configuration.

The configuration of the outer cylindrical electrodes 103 and 104 under certain conditions can excite in the resonator 101, the first radial mode of vibration and the second longitudinal mode along the length of the resonator. Alternatively, the configuration of the outer cylindrical electrodes 103 and 104 under certain conditions can excite in the resonator 101 the first order longitudinal mode of vibration along the wall thickness of the resonator and the second longitudinal mode along the length of the resonator.

In a tubular piezoelectric resonator as described herein, two vibrational modes could be simultaneously excited. The first vibrational mode with natural frequency $v_1$ is either the first order radial mode, where $v_1 = C_{sw}^1/(\pi D)$, or the first order longitudinal mode along the thickness of the resonator, where $v_1 = C_{sw}^1/(2d)$, wherein:

D is the resonator diameter, d is the thickness of a wall forming the piezoelectric resonator, and $C_{sw}^1$ is the velocity of either the radial sound waves or the longitudinal sound waves along the thickness of the resonator, correspondingly.

The radial mode of a tubular piezoresonator is a vibrational mode wherein, for each cross-section perpendicular to the axes of the tubular structure, all points on the outside and inside perimeter of the tubular piezoresonator are caused to move concurrently outward or inward along the radius. The longitudinal mode along the thickness of the tubular piezoresonator is a vibrational mode wherein, for each cross-section perpendicular to the axes of the tubular structure, all points on the outside perimeter of the tubular structure are caused to move along the radius of the cross-section synchronously and in opposite direction in respect to all points on the inside perimeter, and all points along the average diameter of the cross-section remain stationary.

The second longitudinal vibrational mode along the length of the resonator has a frequency $v_2$ defined by the equation below:

$$v_2 = C_{sw}^2/(2L)$$

where 2L is the length of the piezoelectric resonator, and
$C_{sw}^2$ is the velocity of the longitudinal sound waves in the resonator.

In general, $C_{sw}^1 = C_{sw}^2$, but due to the dimensions of the device in FIG. 101 being comparable to the sound wavelength and due to boundary effects, $C_{sw}^1 \neq C_{sw}^2$ in the present embodiment. By selection of its geometrical dimensions, the piezoelectric resonator 101 is made to comply with the following inequality:

$$0.5 \text{ kHz} < |v_1 - v_2| \quad (1)$$

As illustrated in FIG. 1A, common electrode 102 of the piezoelectric resonator 101 can be connected to a contact 108 associated with a signal generator 111. The signal generator is arranged to generate an electrical wave comprised of a series of pulses, for example sinusoidal or rectangular shaped pulses. The electrical wave can have a frequency of $v_3$, for exciting the piezoelectric resonator in a manner that shall be described in further detail below. Ring electrodes 103 and 104 are selectively connected to contacts 109 and 110 respectively of the generator 111 by means of a suitable switching means. The electrical wave can be used to excite the resonator 101 such that the acoustic contact site is caused to have an elliptical movement which is illustrated by the arrows 107 in FIG. 1A. This movement is sometimes referred to herein as a nanoelliptical movement due to the very small scale of the elliptical movement involved.

If the piezoelectric resonator 101 is used in a linear motor configuration, an outer tube 106 is provided, concentric about the piezoelectric resonator. The outer tube 106 is made from a solid material, such as steel. The outer tube is preferably configured to provide a snug engagement with the frictional-acoustical contact site. This can be accomplished by any suitable means. For example, in some embodiments, the outer tube 106 can be formed of a spring steel and may include a slit provided along a length of the outer tube 106. The arrangement can be configured so that the piezoelectric resonator is retained within the outer tube 106 under a spring tension exerted by the tube. Alternatively, the slit can be omitted and the piezoelectric resonator can be snugly fit in the outer tube by heating of the steel tube during a manufacturing step.

When the piezoelectric resonator is electrically excited so as to cause the nanoelliptical movement described herein, the resonator will move relative to the outer tube. More particularly, such nanoelliptical movement will be created when signal generator 111 provides an excitation frequency of $v_3$. This frequency $v_3$ is chosen by selecting the phase difference between the two orthogonal vibrations ($v_1$ and $v_2$) to be close to 90 degrees. More particularly, $v_3$ is chosen so that it is close to the natural frequencies $v_1$ and $v_2$, and produces a phase difference of approximately 90 degrees between the vibrations associated with the even order longitudinal vibration mode at frequency $v_2$ and the first order radial mode at frequency $v_1$ (or the first order longitudinal mode at frequency $v_1$). In general, $v_3$ is considered to be close to the natural frequencies $v_1$ and $v_2$ when the difference between $v_3$ and $v_1$ (or between $v_3$ and $v_2$) is no greater than the approximate difference between $v_1$ and $v_2$. Still, the invention is not limited in this regard and the actual frequency of $v_3$ needed to produce the preferred 90 degree phase difference can depend on several factors. In this regard, the actual frequency of $v_3$ that is needed to achieve this phase condition is dependent on various factors such as the piezoelectric materials and the geometry of the resonator.

The nanoelliptical movement of the acoustic contact sites will cause the piezoelectric resonator 101 to periodically engage and then disengage the interior wall of outer tube 106. This action of the acoustic contact site upon the outer tube will cause the two structures to move relative to each other. The movement will be in a first direction when contact 109 is connected to the signal generator 111, and in a second opposing direction when contact 110 is connected to the signal generator. Consequently, contacts 109 and 110 can be connected alternately to the generator 111 to selectively provide forward or reverse movement.

Figure 2:
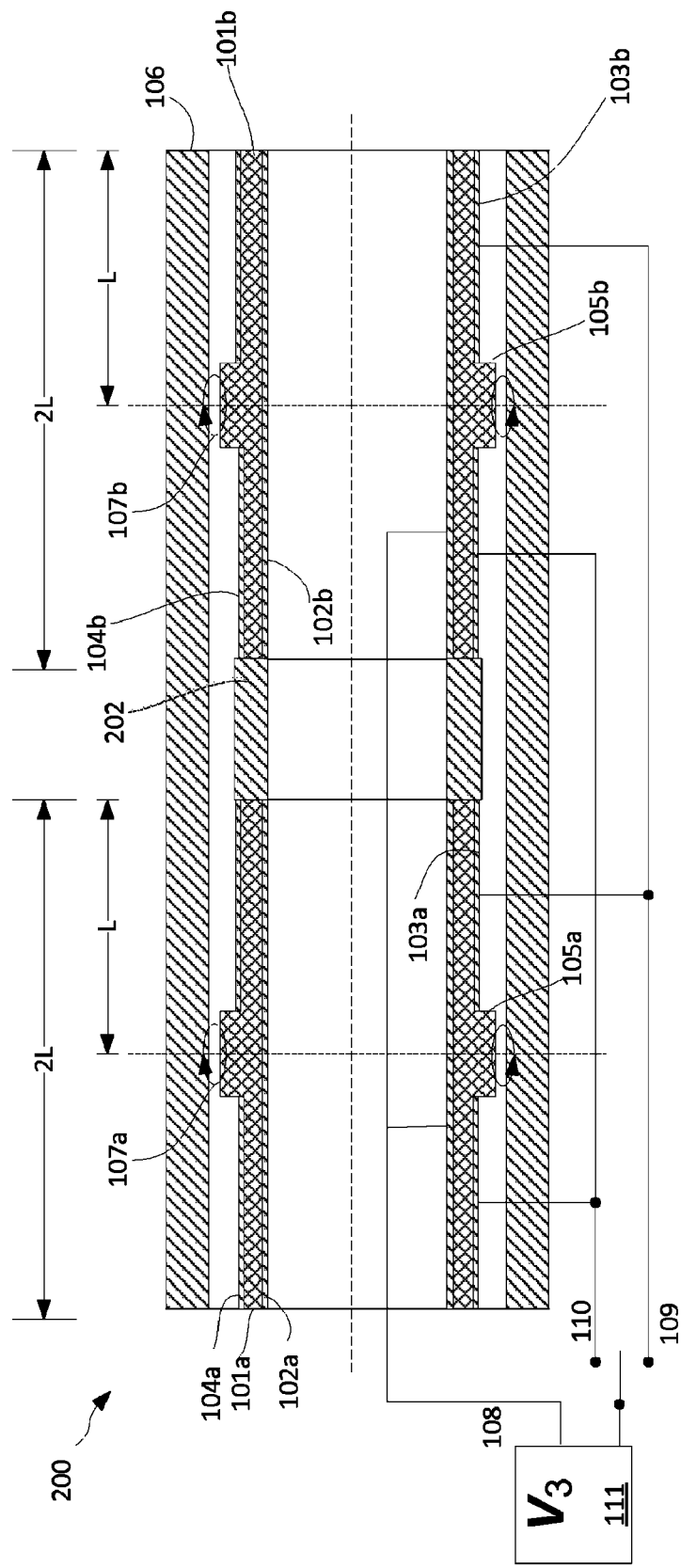
FIG. 2 is an axial cross-sectional view of a second embodiment of a tubular linear piezoelectric motor.

In the embodiment of the invention in FIG. 1, a single piezoelectric resonator of length 2L is used with the outer tube 106. Still, it should be understood that the invention is not limited in this regard. In an alternative embodiment, a plurality of separate piezoelectric resonators 101, each having a length 2L, can be joined together in a cooperative arrangement. For example, in an embodiment illustrated in FIG. 2, a plurality of piezoelectric resonators 101a, 101b can be axially aligned within a an outer tube 6. In such an arrangement, the signal generator 111 can provide an excitation signal $v_3$ as previously described for each piezoelectric resonator. By concurrently exciting the appropriate electrodes 103a, 103b or 104a, 104b of each piezoelectric resonator 101a, 101b, the above-described nano-elliptical movement 107a, 107b can be excited in the annular protrusions 105a, 105b of each resonator. As shown in FIG. 2, the plurality of separate piezoelectric resonators 101a, 101b are advantageously connected to each other by connecting structure 202. The connecting structure 202 can help ensure that the piezoelectric resonators 101a, 101b will move together in unison. The connecting structure 202 is advantageously formed of a rigid material that securely links the resonators 101 together. For example, stainless steel can be used for this purpose. As will be appreciated, the combination of two or more piezoelectric resonators 101a, 101b, where each applies a force to the outer tube 6, will increase the driving force produced by the linear motor as compared to the case where a single piezoelectric resonator is used.

Having described above a basic configuration of the piezoelectric resonator and linear motor with respect to FIGS. 1 and 2, the inventive arrangements will now be described more generally with respect to a tubular linear piezoelectric motor 300 shown in FIG. 3. As illustrated therein, a piezoelectric resonator 301 can be formed of a single cylindrical tube comprised of a piezoelectric material. The piezoelectric resonator is polarized radially, i.e., perpendicular to its cylindrical surface and manufactured, for example, from PZT-material. The resonator has a diameter D, and a wall thickness d as correspondingly shown in FIG. 3. The cylindrical tube forming the resonator 301 has a length $n$L, where L is some length, and n is an even numbered integer (2, 4, 6, . . . ), greater than zero. In the embodiment shown in FIGS. 1 and 2, the value of n is 2. In the embodiment shown in FIG. 3, the value of n is 4, but this example is used to describe the more general case here.

Figure 3:
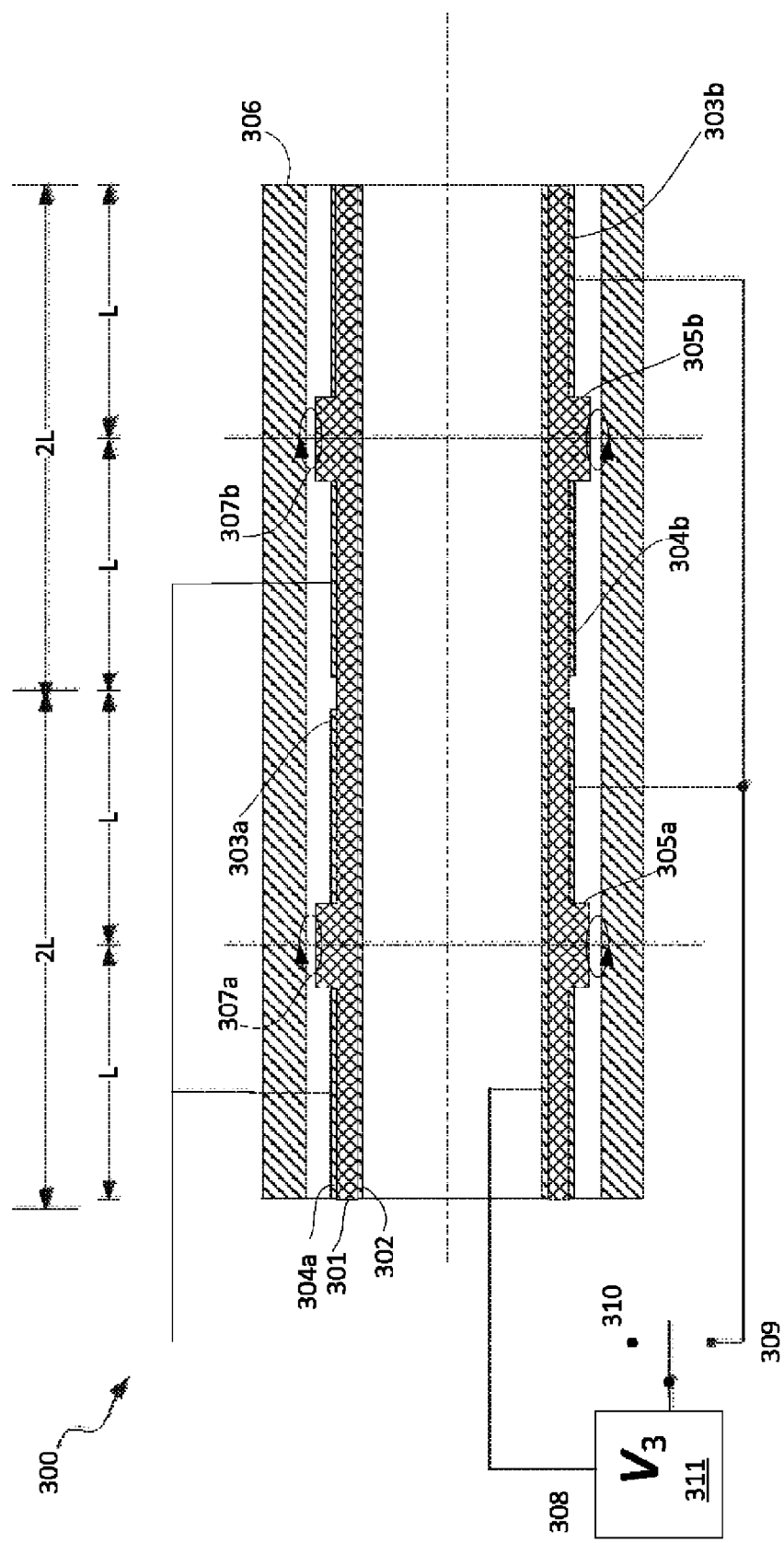
FIG. 3 is an axial cross-sectional view of a third embodiment of a tubular linear piezoelectric motor.

The resonator in FIG. 3 includes a common inner electrode 302 formed of a conductive material disposed on an interior surface of the cylindrical tube. For example, the common inner electrode can be fabricated from silver. One or more annular protrusions 305a, 305b, are provided on the cylindrical tube forming the resonator. The piezoelectric resonator can include as many as n/2 annular protrusions. In the exemplary embodiment shown in FIG. 1, where n=2, there is provided only one (i.e., n/2=1) annular protrusion. In the embodiment shown in FIG. 3, where n=4, there are provided two (i.e., n/2=2) annular protrusions. In some embodiments of the invention, less than the maximum number of annular protrusions can be provided.

Each annular protrusion 305a, 305b is disposed at a different unique location on an exterior surface of the cylindrical tube. Each unique location for a protrusion is spaced a different distance mL from a first end of said cylindrical tube, where m is an odd numbered integer (1, 3, 5, . . . ) and n>m. Accordingly, in the embodiment shown in FIG. 1, there is only one protrusion and its location is determined by mL, where the value of m is 1. In the embodiment shown in FIG. 3, there are two protrusions 305a, 305b, one at each of two different locations where m=1 and 3. In other words, the location of the first protrusion is at 1*L or 1L relative to an end of the cylindrical tube, and the second protrusion is located at 3*L or 3L relative to the end of the cylindrical tube.

A first and a second outer electrode 303a, 304a and 303b, 304b is provided for each annular protrusion. The outer electrodes have identical circular-sections and are formed of a conductive material disposed on an exterior surface of the cylindrical tube. The outer electrodes 303, 304 are respectively located on opposing sides of one of said annular protrusion. Each of the annular protrusions in FIG. 3 comprises an acoustical contact site. When electrically excited in the manner described herein, the piezoelectric resonator causes each acoustical contact site to move along a respective elliptical path (nanoelliptical movement) 307a, 307b as previously described.

In FIG. 3, the configuration of the electrodes 302, 303a, 304a, 303b, 304b can, under certain conditions, excite the resonator 301. When an appropriate exciter signal is provided, the resonator will be excited in both the first radial mode and the $n^{th}$ longitudinal mode along the length of the resonator. The methods and techniques for exciting the resonator are described in greater detail below.

If the piezoelectric resonator is used in a linear motor configuration, it can be disposed concentrically within outer tube 306 which is made of a solid material such as steel. As described above with respect to FIG. 1, the interior surface of outer tube 306 can be formed to snugly engage the acoustical contact sites.

With a piezoelectric resonator length of nL, diameter D, and thickness d as shown in FIG. 3, two vibrational modes can be simultaneously excited. The first vibrational mode with natural frequency $v_1$ is either the first order radial mode, where $v_1 = C_{sw}^1/(\pi D)$, or the first order longitudinal mode along the thickness of the resonator, where $v_1 = C_{sw}^1/(2d)$, and $C_{sw}^1$ is the velocity of either the radial sound waves or the longitudinal sound waves of the resonator, correspondingly. The second vibrational mode is the $n^{th}$ even order longitudinal vibrational mode along the length of the resonator with a frequency of:

$$v_n = v_2 = C_{sw}^2/(2L)$$

where $C_{sw}^2$—velocity of the longitudinal sound waves in the resonator.

In general, $C_{sw}^1 = C_{sw}^2$, but due to the dimensions of the device in FIG. 3 being comparable to the sound wavelength and due to boundary effects, the result will be that $C_{sw}^1 \neq C_{sw}^2$. By selection of its geometrical dimensions, the piezoelectric resonator 301 is made to comply with the following equation:

$$0.5 \text{ kHz} < |v_1 - v_2| \quad (2)$$

A signal generator 311 provides an excitation frequency of $v_3$. The frequency of $v_3$ is chosen so that it is close to the natural frequencies $v_1$ and $v_2$, and produces a phase difference of approximately 90 degrees between the vibrations associated with the even order longitudinal vibration mode at frequency $v_2$ and the first order radial mode at frequency $v_1$ (or the first order longitudinal mode at frequency $v_1$). Consequently, nanoelliptical movement is created at the contact zone(s) of the annular-shaped contact sites. More particularly, common inner electrode 302 is connected to contact 308 of the signal generator 311, which operates at a frequency of $v_3$. The two ring electrodes 303a, 303b are connected to contact 309 and two ring electrodes 304a, 304b are connected to contact 310 of the generator 311. The two ring electrodes 303a, 303b form one group of electrodes for control of movement in forward direction and the two ring electrodes 304a, 304b form another group of electrodes for control of movement in reverse direction. Contacts 309 and 310 can be alternately connected to the generator 311 to selectively provide forward or reverse movement.

The piezoresonators in FIGS. 1-3 can be made from piezoelectric tubing with dimensions of L or 2L. If the dimension tubing has a dimension of L, pairs of tubes can be connected to each other with acoustically conducting materials to achieve an overall length of 2L. The annular-shaped protrusion 105, 105a, 105b, and 305a, 305b may be formed of piezoelectric material. However, in a preferred embodiment, the annular shaped protrusions can be made from an acoustically conductive material with high Q factor, i.e. hard metal.

The operation principles of a tubular linear piezomotor as described herein will now be described in further detail. Mathematically, it can be shown that when the natural frequency of the first radial vibration mode $v_1$ and the natural frequency of the second longitudinal vibration mode $v_2$ are equal, i.e. $v_1 = v_2$, and when the piezoresonator is excited at these frequencies with a phase difference close to 90°, elliptical movement of the protrusion 105, 305 is generated. This movement is illustrated by arrows 107, 307a, 307b in FIGS. 1A, 2 and 3. This nanoelliptical movement at the contact zone creates movement of tube 106, 306 relative to the piezoelectric resonator. However, there are at least two problems with this electrical excitation design. Specifically, these problems are associated with the difficulty of keeping the vibrations independent and keeping the phase shift constant in time. This electrical excitation design requires a separate pair of electrodes for each excitation frequency, and independent frequency generators for each type of oscillation. It will be appreciated that each of these requirements complicates the piezomotor system and makes it less efficient.

In contrast to the foregoing approach, in the proposed motor design of FIGS. 1A and 1B, the two natural frequencies are separated in accordance with equation (1). It can be shown mathematically, and has been confirmed experimentally, that a third frequency situated close to the natural frequencies exists, with the property that when one group of electrodes is excited at this frequency $v_3$, the two natural radial and longitudinal mode vibrations are excited in the piezoresonator, with a definitive phase shift. As a result of the superposition of these two vibrations at the annual protrusion contact sites 105, nanoellipses are formed as per arrows 107. These nanoellipses stimulate relative movement of tube 106 with respect to the piezoelectric resonator 101.

The piezomotor 300 shown in FIG. 3 differs from the arrangement in FIG. 1 in that the resonator length and the configuration of the electrodes are designed for simultaneous excitation of the fourth longitudinal mode along the length of the resonator and the first radial mode along its radius. We can state this in more general terms by saying that the resonator length and configuration of the electrodes are designed for simultaneous excitation of the $n^{th}$ longitudinal mode along the length of the resonator, and the first radial mode along its radius. Alternatively, the resonator length and configuration of the electrodes can be designed for simultaneous excitation of the nth longitudinal mode along the length of the resonator, and the first order longitudinal mode along the thickness of the resonator. In other respects, the piezomotor 300 in FIG. 3 operates in a manner that is similar to that described with respect to FIG. 1.

The geometry of the piezoelectric resonator will generally determine whether the excitation mode will be the first order radial mode versus the first order longitudinal mode along the thickness of the resonator. In particular, the dimensions of D, d and L can be selected in such a way that inequality (1) is fulfilled for only one of the excitation modes. In general, it is advantageous to use the longitudinal mode when D increases to the extent that the frequency of the first order radial mode falls in the audio range. Excitation frequencies in the audio range are generally considered an aural nuisance and therefore not practical to use.

It will be appreciated from the foregoing that exciting the piezoresonator at a single frequency $v_3$, can result in multiple nanoellipses being formed in the annular-shaped protrusions 105, 105a, 105b, 305a, 305b along its whole periphery. In other words, all points along the periphery of the annular protrusion exhibit a pattern of nano-elliptical movement. Note that the motion at each contact point is part of the common motion of the piezoelectric resonator, meaning that each point along the circumference of the annular protrusion moves along an ellipse as indicated by arrows 107, 107a, 107b, 307a, 307b. This dramatically increases the efficiency of the piezomotor by increasing the interface area of the piezoresonator with the outer tube. Further, it should be noted that the elliptical action at each contact point is provided by the combination of the radial and longitudinal mode.

Depending on the design of the motor in FIGS. 1 and 3, either the outer tube 106, 306 could be stationary with the piezoresonator 101, 301 moving within the tube, which then serves as a guide, or the piezoresonator could be stationary, acting as an actuator, with the tube moving relative to it. The tubular linear piezoelectric motor is configured so that excitation of the first outer electrode (or group of electrodes) with the exciter signal produces linear displacement as between the outer tube and the resonator in a first linear direction aligned with the axis of the outer tube. Conversely, excitation of the second outer electrode (or group of electrodes) produces the linear displacement in a second direction opposite to the first direction.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A tubular linear piezoelectric motor, comprising:
    a resonator formed of a cylindrical tube of length $nL$ comprised of a piezoelectric material, where L is some length, and $n$ is an even numbered integer, greater than zero;
    an inner electrode formed of a conductive material disposed on an interior surface of said cylindrical tube;
    one or more annular protrusions, each disposed at a different unique location on an exterior surface of said cylindrical tube, each said unique location spaced a different distance $mL$ from a first end of said cylindrical tube, where $m$ is an odd numbered integer and $n>m$;
    a first outer electrode provided for each annular protrusion, each of said first outer electrode formed of a conductive material disposed on said exterior surface of said cylindrical tube, and respectively located on one side of a respective one of said annular protrusions; and
    wherein each of said annular protrusions comprises a contact site, and said cylindrical tube is configured to move said contact site along a respective elliptical path when said resonator is excited with one signal having a single exciter frequency that is applied across said inner electrode and said first outer electrodes.

2. The tubular linear piezoelectric motor according to claim 1, further comprising an exciter configured to generate said signal.

3. The tubular linear piezoelectric motor according to claim 1, wherein said resonator is snugly disposed within an outer tube, and said contact site is configured to frictionally engage an inner surface of said outer tube when said contact site moves along said elliptical path.

4. The tubular linear piezoelectric motor according to claim 3, further comprising at least a second outer electrode, each said second outer electrode formed of a conductive material disposed on said exterior surface of said resonator, and respectively located on one side of a respective one of said annular protrusions opposed from said first outer electrode.

5. The tubular linear piezoelectric motor according to claim 4, wherein a plurality of said second outer electrodes, distinct from said first outer electrodes, are electrically connected to form a second group of electrodes configured for concurrent excitation.

6. The tubular linear piezoelectric motor according to claim 4, wherein excitation of said first outer electrode with said signal produces linear displacement as between said outer tube and said resonator in a first direction, and excitation of said second outer electrode produces said linear displacement in a second direction opposite to said first direction.

7. The tubular linear piezoelectric motor according to claim 1, wherein a plurality of said first outer electrodes are electrically connected to form a first group of electrodes configured for concurrent excitation.

8. The tubular linear piezoelectric motor according to claim 1, wherein said piezoelectric material of said cylindrical tube is polarized in a radial direction, perpendicular at each point to said interior and exterior surface of said cylindrical tube.

9. The tubular linear piezoelectric motor according to claim 1, wherein a natural frequency $v_2$ of an $n^{th}$ even order longitudinal vibration mode in a direction along said length of said resonator is equal to $C_{sw}^2/(2L)$, where $C_{sw}^2$ is the velocity of sound waves traveling in a longitudinal direction aligned with the length of the resonator.

10. The tubular linear piezoelectric motor according to claim 9, wherein a natural frequency $v_1$ of a first order radial mode of said resonator is equal to $C_{sw}^1/(\pi D)$, where D is a diameter of the cylindrical tube, and is the velocity of the sound waves traveling in a radial direction within the resonator.

11. The tubular linear piezoelectric motor according to claim 10, wherein said resonator is configured so that 0.5 kHz<$|v_1-v_2|$.

12. The tubular linear piezoelectric motor according to claim 9, wherein a natural frequency $v_1$ of a first order longitudinal mode along the thickness of the resonator is equal to $C_{sw}^1/(\pi d)$, where d is a thickness d of the cylindrical tube, and $C_{sw}^1$ is the velocity of the sound waves traveling in a longitudinal direction within the thickness d of the resonator.

13. The tubular linear piezoelectric motor according to claim 12, wherein said resonator is configured so that 0.5 kHz<$|v_1-v_2|$.

14. The tubular linear piezoelectric motor according to claim 13, wherein said single exciter frequency $v_3$ is close to the natural frequencies $v_1$ and $v_2$ and produces a phase difference of approximately 90 degrees between the vibrations associated with the even order longitudinal vibration mode at frequency $v_2$ and the first order longitudinal mode at frequency $v_1$.

15. The tubular linear piezoelectric motor according to claim 10, wherein said single exciter frequency $v_3$ is close to the natural frequencies $v_1$ and $v_2$ and produces a phase difference of approximately 90 degrees between the vibrations associated with the even order longitudinal vibration mode at frequency $v_2$ and the first order radial mode at frequency $v_1$.

16. A method for exciting a tubular resonator in a linear piezoelectric motor, comprising:
   snugly disposing within an outer tube a resonator formed of a cylindrical tube of length $nL$ comprised of a piezoelectric material, where L is some length, and n is an even numbered integer, greater than zero;
   coupling an exciter signal to an inner electrode formed of a conductive material disposed on an interior surface of said cylindrical tube;
   arranging one or more annular protrusions, each at a different unique location on an exterior surface of said cylindrical tube, each said unique location spaced a different distance mL from a first end of said cylindrical tube, where m is an odd numbered integer and n>m;
   coupling said exciter signal to one or more first outer electrodes formed of a conductive material disposed on said exterior surface of said cylindrical tube on one side of each said annular protrusion; and
   exciting said resonator with one signal having a single exciter frequency applied across said inner electrode and said one or more first outer electrodes, said single exciter frequency selected to move a contact site of said one or more annular protrusions along an elliptical path when said resonator is excited.

17. The method according to claim 16, wherein said contact site frictionally engages an inner surface of said outer tube when said contact site moves along said elliptical path.

18. The method according to claim 17, further comprising alternately exciting said resonator at said exciter frequency using at least a second outer electrode, each said second outer electrode formed of a conductive material disposed on said exterior surface of said cylindrical tube, and respectively located on one side of a respective one of said annular protrusions opposed from said first outer electrode.

19. The method according to claim 18, wherein a plurality of said second outer electrodes, distinct from said first outer electrodes, are concurrently excited as a second group of electrodes.

20. The method according to claim 18, wherein excitation of said first outer electrode with said signal produces linear displacement as between said outer tube and said resonator in a first direction, and excitation of said second outer electrode produces said linear displacement in a second direction opposite to said first direction.

21. The method according to claim 16, wherein a plurality of said first outer electrodes are concurrently excited as a first group of electrodes.

22. The method according to claim 16, wherein said piezoelectric material of said cylindrical tube is polarized in a radial direction, perpendicular at each point to said interior and exterior surface of said cylindrical tube.

23. The method according to claim 16, wherein a natural frequency $v_2$ of an $n^{th}$ even order longitudinal vibration mode in a direction along said length of said resonator is equal to $C_{sw}^2/(2L)$, where $C_{sw}^2$ is the velocity of sound waves traveling in a longitudinal direction aligned with the length of the resonator.

24. The method according to claim 23, wherein a natural frequency $v_1$ of a first order radial mode of said resonator is equal to $C_{sw}^1/(\pi D)$, where D is a diameter of the cylindrical tube, and $C_{sw}^1$ is the velocity of the sound waves traveling in a radial direction within the resonator.

25. The method according to claim 24, wherein one or more dimensions of said resonator are selected so that 0.5 kHz<$|v_1-v_2|$.

26. The method according to claim 23, wherein a natural frequency $v_1$ of a first order longitudinal mode along the thickness of the resonator is equal to $C_{sw}^1/(\pi d)$, where d is a thickness d of the cylindrical tube, and the velocity of the sound waves traveling in a longitudinal direction within the thickness d of the resonator.

27. The method according to claim 26, wherein one or more dimensions of said resonator are selected so that 0.5 kHz<$|v_1-v_2|$.

28. The method according to claim 27, wherein said single exciter frequency $v_3$ is chosen to be close to the natural frequencies $v_1$ and $v_2$ and produces a phase difference of approximately 90 degrees between the vibrations associated with the even order longitudinal vibration mode at frequency $v_2$ and the first order longitudinal mode at frequency $v_1$.

29. The method according to claim 24, wherein said single exciter frequency $v_3$ is chosen to be close to the natural frequencies $v_1$ and $v_2$ and produces a phase difference of approximately 90 degrees between the vibrations associated with the even order longitudinal vibration mode at frequency $v_2$ and the first order radial mode at frequency $v_1$.

30. A tubular linear piezoelectric motor, comprising:
- a resonator formed of a cylindrical tube of length $nL$ comprised of a piezoelectric material, where L is some length, and n is an even numbered integer, greater than zero;
- an inner electrode formed of a conductive material disposed on an interior surface of said cylindrical tube;
- an annular protrusion disposed at a location on an exterior surface of said cylindrical tube, said location spaced a distance mL from a first end of said cylindrical tube, where m is an odd numbered integer and n>m;
- a first outer electrode formed of a conductive material disposed on said exterior surface of said cylindrical tube, and located on one side of said annular protrusion; and
- wherein said annular protrusion comprises a contact site, and said cylindrical tube is configured to move said contact site along a respective elliptical path when said resonator is excited with one signal having a single exciter frequency that is applied across said inner electrode and said first outer electrode.

31. A method for exciting a tubular resonator in a linear piezoelectric motor, comprising:
- snugly disposing within an outer tube a resonator formed of a cylindrical tube of length $nL$ comprised of a piezoelectric material, where L is some length, and n is an even numbered integer, greater than zero;
- coupling an exciter signal to an inner electrode formed of a conductive material disposed on an interior surface of said cylindrical tube;
- arranging an annular protrusion at a location on an exterior surface of said cylindrical tube, said location spaced a distance mL from a first end of said cylindrical tube, where m is an odd numbered integer and n>m;
- coupling said exciter signal to a first outer electrode formed of a conductive material disposed on said exterior surface of said cylindrical tube on one side of said annular protrusion; and
- exciting said resonator with one signal having a single exciter frequency applied across said inner electrode and said first outer electrode, said single exciter frequency selected to move a contact site of said annular protrusion along an elliptical path when said resonator is excited.

* * * * *